US012107532B2

(12) United States Patent
Higashi

(10) Patent No.: US 12,107,532 B2
(45) Date of Patent: Oct. 1, 2024

(54) PEDESTAL FOR SOLAR POWER GENERATION DEVICES INTEGRATED WITH SOLAR POWER GENERATION PANELS

(71) Applicant: SHIMIN ENERUGI-CHIBA KABUSHIKI KAISYA, Chiba (JP)

(72) Inventor: Mitsuhiro Higashi, Chiba (JP)

(73) Assignee: SHIMIN ENERUGI-CHIBA KABUSHIKI KAISYA, Chiba (JP)

( * ) Notice: Subject to any disclaimer, the term of this patent is extended or adjusted under 35 U.S.C. 154(b) by 175 days.

(21) Appl. No.: 17/629,150

(22) PCT Filed: Jul. 23, 2019

(86) PCT No.: PCT/JP2019/028853
§ 371 (c)(1),
(2) Date: Jan. 21, 2022

(87) PCT Pub. No.: WO2021/014569
PCT Pub. Date: Jan. 28, 2021

(65) Prior Publication Data
US 2022/0271705 A1    Aug. 25, 2022

(51) Int. Cl.
*H02S 30/10* (2014.01)
*H02S 20/10* (2014.01)
(Continued)

(52) U.S. Cl.
CPC .............. *H02S 30/10* (2014.12); *H02S 20/10* (2014.12); *H02S 40/34* (2014.12); *H02S 40/36* (2014.12); *H02S 40/425* (2014.12)

(58) Field of Classification Search
CPC .......... H02S 30/10; H02S 20/10; H02S 40/34; H02S 40/36; H02S 40/425
See application file for complete search history.

(56) References Cited

U.S. PATENT DOCUMENTS

2012/0279492 A1   11/2012  Spinelli et al.
2014/0373900 A1   12/2014  Lamkin et al.
(Continued)

FOREIGN PATENT DOCUMENTS

CN       101997042 A       3/2011
CN       103548150 A       1/2014
(Continued)

OTHER PUBLICATIONS

International Search Report and Written Opinion dated Sep. 10, 2019 for International Patent Application No. PCT/JP2019/028853.
Chinese Office Action dated Oct. 24, 2023 for Chinese Application No. 201980098425.1.

*Primary Examiner* — Golam Mowla
(74) *Attorney, Agent, or Firm* — EIP US LLP

(57) ABSTRACT

[Problem]To propose a simplified configuration with which a solar power generation device can be easily and quickly assembled and installed and to propose a solar power generation device configuration with which the wind resistance is preferably more reduced.
[Solution] The solar power generation device supporting frame integrated with a solar power generation panel is fixed to at least one of a plurality of supporting poles projected upward from an installation base surface, has a rod-like body appearance, and has a solar power generation panel integrally provided at least along the upper side curved surface thereof without being separated from the upper side curved surface. Preferably, the solar power generation device supporting frame integrated with the solar power generation panel is fixed to the supporting poles horizontally.

18 Claims, 3 Drawing Sheets

(51) Int. Cl.
    *H02S 40/34*     (2014.01)
    *H02S 40/36*     (2014.01)
    *H02S 40/42*     (2014.01)

(56) References Cited

U.S. PATENT DOCUMENTS

| | | | |
|---|---|---|---|
| 2016/0056321 A1* | 2/2016 | Atwater | H01L 31/0687 |
| | | | 136/246 |
| 2017/0202155 A1* | 7/2017 | Iwai | E04B 7/18 |
| 2017/0331426 A1* | 11/2017 | Petrova-Koch | H10K 77/111 |
| 2018/0076758 A1 | 3/2018 | Miranda | |
| 2019/0058436 A1 | 2/2019 | Atchley et al. | |
| 2019/0116742 A1* | 4/2019 | Denton | B05B 15/625 |
| 2019/0148576 A1* | 5/2019 | Netter | H02S 20/23 |
| | | | 136/251 |

FOREIGN PATENT DOCUMENTS

| | | |
|---|---|---|
| CN | 203687422 U | 7/2014 |
| CN | 107004728 A | 8/2017 |
| JP | 51065667 U | 5/1976 |
| JP | 07027170 U | 5/1995 |
| JP | 2000277782 A | 10/2000 |
| JP | 2013133668 A | 7/2013 |
| JP | 2016164954 A | 9/2016 |
| JP | 2017200388 A | 11/2017 |
| JP | 2018019455 A | 2/2018 |
| KR | 101934798 B1 | 1/2019 |
| WO | 2013108878 A | 7/2013 |
| WO | 2013108878 A1 | 5/2015 |

\* cited by examiner (a)

(b)

PEDESTAL FOR SOLAR POWER GENERATION DEVICES INTEGRATED WITH SOLAR POWER GENERATION PANELS

TECHNICAL FIELD

The present invention relates to a pedestal for solar power generation devices integrated with solar power generation panels and the like.

BACKGROUND ART

Conventionally, single pipes, dedicated supporting columns, are the like are often used for a pedestal for installing power generation panels of a solar power generation device. Since single pipes and the like have an extremely high degree of freedom in structure, workers can make fine adjustments and install them according to the situation. On the other hand, it is known that the sense and skill of the installation worker are greatly reflected in the work efficiency and the installation accuracy due to the high degree of freedom. It is also known that, since the work itself is not so standardized, there is a concern that it takes time and effort, the number of work processes increases, and the number of construction days tends to increase.

For example, in Patent Document 1 discloses an invention that provides a pedestal for solar power generation panels based on pipe members capable of easily constructing an appropriate pedestal without requiring positional accuracy for placing base pile pipes and appropriately providing an open passage that workers can enter and exit on the lower side of the pedestal for utilization of land and maintenance.

According to this document, a horizontal base pipe is fixed to a pair of base pile pipes driven into the ground so as to be bridged across the pile pipes, whereby a base portion is formed. A plurality of base portions are arranged in a row and a plurality of horizontal base pipes are arranged so that heights thereof are equal, whereby A full English translation of the specification of PCT/JP2019/028853 rows of base portions are formed. A row of foundation pipes are fixed onto the plurality of horizontal base pipes so as to be bridged across a row of foundation horizontal pipes formed by a row of base portions whereby a line-shaped foundation portion is formed. A plurality of line-shaped foundation portions are arranged in parallel whereby rows of line-shaped foundation portions are formed so that an open passage that workers can enter and exit. Using the rows of line-shaped foundation portions as foundations, supporting column pipes for supporting a solar power generation panel are fixed to the foundation pipes so as to stand up whereby the pedestal is constructed.

It is stated that the pedestal for solar power generation panels based on pipe members provides a special and advantageous effect that it is possible to easily construct an appropriate pedestal without requiring positional accuracy for placing base pile pipes and appropriately provide an open passage that workers can enter and exit on the lower side of the pedestal for utilization of land and maintenance.

When single pipes, piles, and the like are used as in Patent Document 1, conventionally, the process for installing a solar power generation device roughly requires the following three steps. First, supporting columns and pedestals are installed using single pipes, piles, and the like. Subsequently, the solar power generation panels are attached and fixed to the pedestals. Subsequently, a lead out wiring and the like, in which the wirings of a plurality of solar power generation panels that are attached and fixed are connected and led out so that electricity can be collected and taken out, are required.

CITATION LIST

Patent Document

Patent Document 1: Japanese Patent Application Laid-Open No. 2018-019455

SUMMARY OF THE INVENTION

Problems to be Solved by the Invention

However, although many installation processes of solar power generation devices as described above are for the use of natural energy, they require a lot of labor, cost and time. Thus, from the viewpoint of reducing the burden on the environment, it is preferable to have a structure that is simplified as much as possible and that can install the solar power generation device easily and quickly. In particular, in the case of a large-scale power generation facility, the number of solar power generation panels used for the facility will be enormous, and it will be a heavy burden to install each one on a supporting column or a pedestal at the site. In particular, when the installation work is performed at a high place, the panel may be fanned on a windy day, and it is also necessary to lift (or pull up) the solar power generation panel to a high place for attachment, which is an excessively heavy burden.

Conventionally, in order to install a solar power generation device, a complex operation including the process of assembling the supporting columns and pedestals for supporting the solar power generation panels, the process of attaching and fixing the solar power generation panels to the supporting columns and the pedestals thereafter, and further the process of connecting the wirings of the attached solar power generation panels is required. Thus, there is a demand for a solar power generation device capable of simplifying the complex operation as much as possible so that the solar power generation device can be assembled and installed at a lower cost and a smaller number of processes.

The present invention has been made in view of the above-mentioned problems, and an object of the present invention is to propose a structure that is simplified and that can assemble and install a solar power generation device easily and quickly with a smaller number of processes. Preferably, an object thereof is to propose a structure of a solar power generation device that further reduces wind resistance and enables plant cultivation under the panels.

Solutions to Problems

In a pedestal for solar power generation devices integrated with solar power generation panels according to the present invention, the pedestal is fixed to at least one of a plurality of supporting columns projecting upward in an installation area, and the pedestal has a rod shape and is integrally provided at least along a curved upper surface thereof in a state in which an entire surface of a solar power generation panel is not separated from the curved upper surface.

Preferably, in the pedestal for solar power generation devices integrated with solar power generation panels according to the present invention, the pedestal is horizontally fixed to the supporting column.

More preferably, in the pedestal for solar power generation devices integrated with solar power generation panels according to the present invention, an engagement portion capable of connecting the pedestal for solar power generation devices integrated with solar power generation panels to another pedestal for solar power generation devices integrated with solar power generation panels to form a rod-shaped body (for example, a beam) is provided at an edge thereof.

Still more preferably, in the pedestal for solar power generation devices integrated with solar power generation panels according to the present invention, the edge has an electrical connection portion that electrically connects both wirings to be engaged.

Still more preferably, in the pedestal for solar power generation devices integrated with solar power generation panels according to the present invention, when the pedestal for solar power generation devices integrated with solar power generation panels is connected to another pedestal for solar power generation devices integrated with solar power generation panels to form a rod-shaped body, the electrical connection portion is configured as a joint connector that completes electrical connection simultaneously with the physical connection.

Still more preferably, in the pedestal for solar power generation devices integrated with solar power generation panels according to the present invention, the pedestal has a first cavity so that cooling water can pass therein along a longitudinal direction thereof.

Still more preferably, in the pedestal for solar power generation devices integrated with solar power generation panels according to the present invention, the first cavity is provided with a plurality of sprinkling holes at a bottom so that plants cultivated in the installation area can be watered.

Still more preferably, in the pedestal for solar power generation devices integrated with solar power generation panels according to the present invention, the pedestal has a second cavity so that wirings are accommodated therein along a longitudinal direction thereof.

Still more preferably, in the pedestal for solar power generation devices integrated with solar power generation panels according to the present invention, the solar power generation panel is configured as a sheet-type panel, and is configured to be removable and replaceable by sliding from a base of the pedestal for solar power generation devices.

Still more preferably, in the pedestal for solar power generation devices integrated with solar power generation panels according to the present invention, a cross-sectional shape thereof is a half-pipe shape having a curved upper surface and a flat bottom surface.

Still more preferably, in the pedestal for solar power generation devices integrated with solar power generation panels according to the present invention, the base of the pedestal for solar power generation devices is formed of an aluminum material.

Still more preferably, in the pedestal for solar power generation devices integrated with solar power generation panels according to the present invention, the solar power generation panel is a perovskite thin-film solar cell.

Still more preferably, in the pedestal for solar power generation devices integrated with solar power generation panels according to the present invention, the base of the pedestal for solar power generation devices is formed of a transparent resin material.

Still more preferably, in the pedestal for solar power generation devices integrated with solar power generation panels according to the present invention, the base of the pedestal for solar power generation devices is formed in a hollow cylindrical shape so that water can pass therein.

Still more preferably, in the pedestal for solar power generation devices integrated with solar power generation panels according to the present invention, the solar power generation panel is integrally and inseparably provided around an entire circumference of the base of the pedestal for solar power generation devices.

Still more preferably, in the pedestal for solar power generation devices integrated with solar power generation panels according to the present invention, the solar power generation panel is coated around the entire circumference of the base of the pedestal for solar power generation devices.

Effects of the Invention

It is possible to realize a structure that is simplified and that can install a solar power generation device easily and quickly.

BRIEF DESCRIPTION OF DRAWINGS

FIG. 3 is a diagram illustrating a cylindrical pedestal for solar power generation devices as another form of the pedestal for solar power generation devices integrated with solar power generation panels, in which FIGS. 3(b) to 3(d) are cross-sectional views of a connection portion, for explaining a connection mode when connecting the cylindrical pedestals for solar power generation devices.

MODE FOR CARRYING OUT THE INVENTION

FIG. 1(a) is an overall view of a frame-shaped assembly of a pedestal 1000 for solar power generation devices integrated with solar power generation panels connected and fixed to supporting columns 1100. The supporting columns 1100 are driven into the ground to a predetermined depth so as to project, and the pedestal 1000 for solar power generation devices integrated with solar power generation panels is conventionally merely a pedestal (single pipe, supporting column frame, or the like).

For this reason, in the past, the work of first assembling the pedestal in a grid pattern and then attaching a solar power generation panel to the pedestal was performed. However, when panels integrated with pedestals are used, the assembling process becomes easy, the number of processes is reduced, and the assembly work can be performed quickly.

In the pedestal 1000 for solar power generation devices integrated with solar power generation panels, the thickness, shape, and length can be made almost the same as those of the conventional pedestal and supporting column frame such as single pipes. Thus, the light receiving curved surface on the upper surface thereof eliminates the need for a sun tracking device, and the same amount of power generation can be secured from morning to evening.

Further, this pedestal reduces the wind resistance and simplifies the assembly process, and can be formed in a power strip shape such that engagement and wiring connection is completed when it is mechanically assembled. For example, when the pedestal 1000 for solar power generation devices integrated with solar power generation panels has a cylindrical shape or a semi-cylindrical shape, one end can be used as a positive electrode and the other end can be used as a negative electrode like the electrodes of a single dry battery. Thus, it is also possible to give it a mechanical joint coupling function and coupling locking function.

Figure 1:
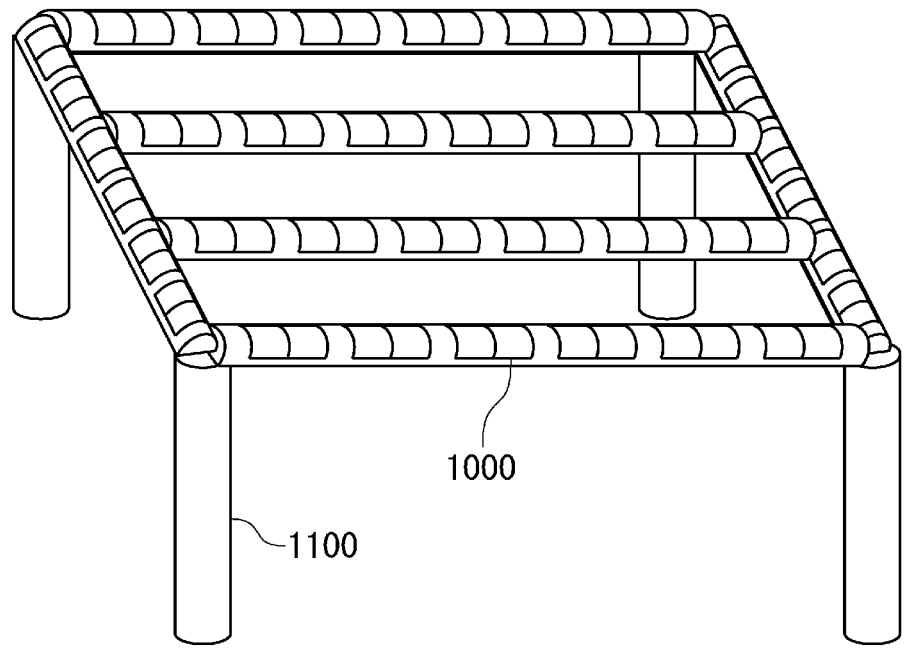
FIG. 1(a) is an overall view of a frame-shaped assembly of a pedestal for solar power generation devices integrated with solar power generation panels connected and fixed to supporting columns 1100.
FIG. 1(b) is a perspective view for explaining the outline of the structure of the pedestal for an integrated solar power generation apparatus.
Figure 1:
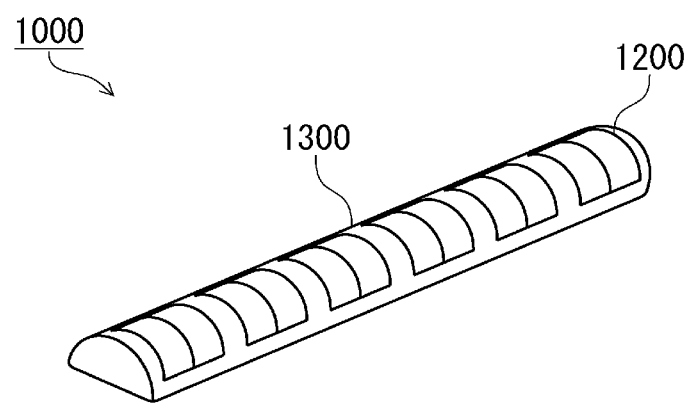

As can be understood from FIG. 1(*a*), since the pedestal 1000 for solar power generation devices integrated with solar power generation panels has sufficient strength as a structure, the interval between the supporting columns 1100 preferably forms a space that includes the overhead and allows passenger tractors and passenger combine harvesters to pass through. In this way, it possible to promote agricultural work such as planting in the space on a large scale and efficiently using large-scale agricultural equipment. When the solar power generation panel is provided such high above the head, the influence of the wind is generally large, so that excessive supporting column foundations and the like are required, which poses a problem in terms of cost. However, the pedestal 1000 for solar power generation devices integrated with solar power generation panels of the present invention itself is a rod-shaped body and functions as a supporting column, and is less susceptible to wind resistance due to its shape and size. Thus, it is also suitable for installation at high places.

FIG. 1(*b*) is a perspective view for explaining the outline of the configuration of the pedestal 1000 for solar power generation devices integrated with solar power generation panels. FIG. 1(*b*) describes a case where the pedestal 1000 for solar power generation devices integrated with solar power generation panels has a semi-cylindrical shape, but it may have a cylindrical shape or another rod shape. It has both a supporting column frame function and a solar power generation function, and in terms of the outer diameter, size, length, and shape, it can be handled and assembled substantially in the same manner as the conventional supporting column frames such as single pipes.

Therefore, as shown in FIG. 1(*b*), a typical pedestal 1000 for solar power generation devices integrated with solar power generation panels has a shape in which sheet-shaped thin-film solar cell panels 1200 are integrally attached to a curved surface portion of the upper surface of a base 1300 in the conventional supporting column frame state without being separated from the base 1300. In FIG. 1(*b*), a plurality of thin-film solar cell panels 1200 are detachably attached to the base 1300, but one sheet-shaped thin-film solar cell panel 1200 may be detachably attached to one rod-shaped base 1300.

As shown in FIG. 1(*b*), the sheet-shaped thin-film solar cell panels 1200 are provided integrally along the curved surface of the upper surface of the base 1300 without being separated from the curved surface. Therefore, it can be expected that a nearly constant amount of power generation is obtained from morning to night in any season, regardless of the altitude and direction of sunlight even if the sun tracking function is not provided. In addition, because it has a curved surface shape that is convex upward from the upper surface thereof, it has little resistance to wind and rain, so there is no concern that it will be blown away by wind or the like.

Moreover, since the pedestal 1000 for solar power generation devices integrated with solar power generation panels is a rod-shaped body and has the same size and thickness as the conventional supporting column frames and the like, even when a plurality of pedestals 1000 for solar power generation devices integrated with solar power generation panels is provided overhead, sufficient sunlight and outside air are incident from the gaps between them. For this reason, even if a plurality of pedestals 1000 for solar power generation devices integrated with solar power generation panels is installed with a slight gap above the head, the space below can be used as a space for cultivating crops or a relaxing space such as a cafe space for enjoying tea or a space for reading books. This enables a completely different solar sharing experience to be created as compared with the conventional solar power generation panel in which the soil is devastated or turned into concrete desert because no sunlight is incident and no grass grows under the panel.

It is known that when cultivating crops, a saturation point light quantity for photosynthesis for cultivation is known for each crop, and excessive sunlight irradiation above the saturation point rather lowers the productivity of the crop. For this reason, the installation interval, the number of installations, the installation density, and the like of the pedestals 1000 for solar power generation devices integrated with solar power generation panels may be adjusted so as to obtain the light quantity optimum for crops cultivated in the lower space of the pedestal 1000 for solar power generation equipment integrated with solar power generation panels installed overhead (typically, light quantity of saturated light intensity for an arbitrary fixed period such as yearly or monthly or daily). Even in this case, since the pedestals 1000 for solar power generation devices integrated with solar power generation panels can be substantially handled as rod-shaped supporting column frames such as single pipes, attachment, removal, and relocation work are very easy. Thus, it is desirable because a sunlight quantity for harvesting crops as much as possible can be obtained in the lower space and solar power can be generated overhead.

Figure 2:
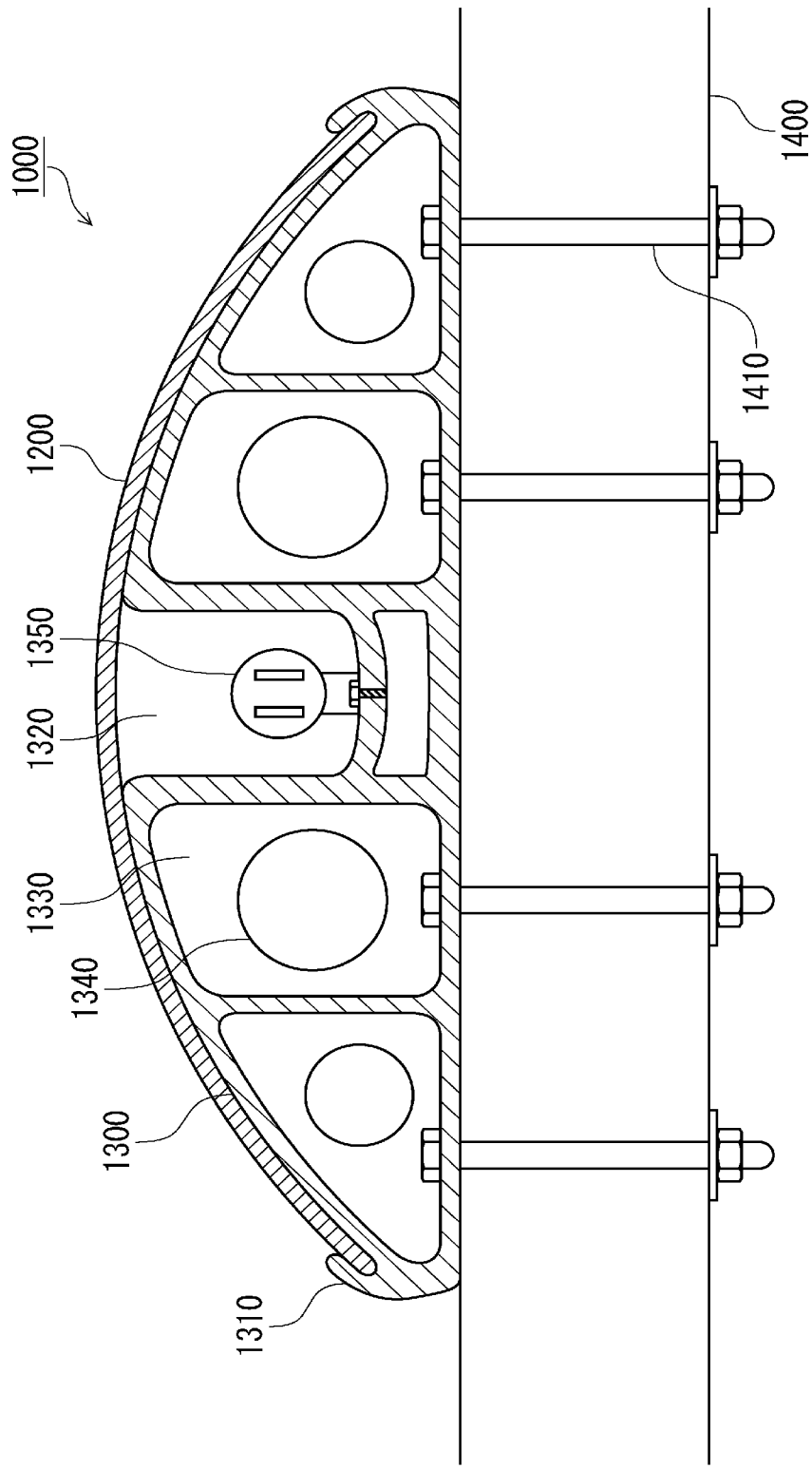
FIG. 2 is a conceptual diagram for explaining a cross-sectional structure at an end of the pedestal for solar power generation devices integrated with solar power generation panels.

FIG. 2 is a conceptual diagram for explaining a cross-sectional structure at an end of the pedestal 1000 for solar power generation devices integrated with solar power generation panels. As shown in FIG. 2, the pedestal 1000 for solar power generation devices integrated with solar power generation panels has a framework structure function as a part of a supporting column, and has the sheet-shaped thin-film solar cell panel 1200 on the curved upper surface so that the panel 1200 can be slidably stored and withdrawn by locking claws 1310. The pedestal 1000 also includes a plurality of internal cavities extended in the longitudinal direction.

As an example, the cross section of the pedestal 1000 for solar power generation devices integrated with solar power generation panels shown in FIG. 2 has a half-pipe shape having an upwardly convex curved upper surface and a flat bottom surface. The pedestal 1000 has four first cavities 1330 through which cooling water can pass and a second cavity 1320 in which wirings are accommodated.

FIG. 2 shows a structure in which a water passage hose 1340 is arranged in the first cavity 1330 so that the cooling water passes through the water passage hose 1340, but a structure that allows water to pass directly into the first cavity 1330 may be employed. In addition, when sprinkling holes are appropriately formed below the water passage hose 1340 or the first cavity 1330, the crops cultivated in the lower space can be automatically watered, or the holes can be used for sprinkling the cooling coolant in the summer. In addition, the passage of water can cool the pedestal 1000 for solar power generation devices integrated with solar power generation panels to suppress a decrease in power generation efficiency, and the water after the passage can be used as hot water (that is, a solar water heater).

In FIG. 2, the second cavity 1320 in which wirings are accommodated is formed by a central recess provided at the top of the curved surface of the base 1300 and the sheet-shaped thin-film solar cell panel 1200 that closes the central recess as a lid. According to such an embodiment, when the sheet-shaped thin-film solar cell panel 1200 is slid and withdrawn, the wiring space is exposed to the outside, which facilitates maintenance and replacement of the wirings from the outside, which is preferable. However, the present invention is not limited to this, and it is sufficient that an internal cavity is provided such that wirings can be accommodated in the longitudinal direction of the rod-shaped pedestal 1000 for solar power generation devices integrated with solar power generation panels.

As shown in FIG. 2, when a plurality of pedestals 1000 for solar power generation devices integrated with solar power generation panels are connected to form a longer rod-shaped body, the electrical connection between them can be configured by a joint connector 1350 having an optional shape and configuration. For example, the mechanical and structural connection of the plurality of connected pedestals 1000 for solar power generation devices integrated with solar power generation panels is realized, and a male-female outlet state in which the pedestals are automatically electrically connected is realized without requiring an additional wiring connection work. This is preferable because it is possible to reduce the labor and time and the number of processes for wiring connection.

An engagement portion (not shown) may be provided at both ends in order to more easily connect the plurality of pedestals 1000 for solar power generation devices integrated with solar power generation panels. The engagement portions may adopt any known structure such that they can be connected to each other with one touch, and more preferably can be locked in the connected state.

In FIG. 2, an example in which the pedestal is attached and fixed to another structure 1400 such as the supporting column 1100 with bolts and nuts 1410 is illustrated, but the present invention is not limited to this, and other locking jigs may be used, and an optional fixing method for locking and fixing single pipes or various supporting columns to each other may be used. The other structure 1400 such as the supporting column 1100 constitutes the framework of the solar power generation device together with the pedestal 1000 for solar power generation devices integrated with solar power generation panels, but the pedestal 1000 for solar power generation devices integrated with solar power generation panels itself serves as a part of the structure as the framework.

Therefore, no other framework or rod-shaped body is required in parallel with or adjacent to the pedestal 1000 for solar power generation devices integrated with solar power generation panels. From another point of view, the supporting columns of the framework (rod-shaped body) suspended in the substantially horizontal direction themselves generate solar power without substantially increasing the outer shape and size, preferably accommodate the wirings thereof, more preferably enable water to pass therein, still more preferably enable the passed water to be sprinkled into the solar power generation area (installation area).

FIG. 3(a) is a diagram illustrating a cylindrical pedestal for solar power generation devices 3000 as another form of the pedestal 1000 for solar power generation devices integrated with solar power generation panels. The cylindrical pedestal 3000 for solar power generation devices is provided with perovskite cells on the surface thereof like a spray coating. For this reason, the cylindrical pedestal 3000 for solar power generation devices has a function of a supporting column or the like and a power generation function, and enables wirings, and water to pass in the internal space. In other words, it is a multi-hybrid solar power generation supporting column that has all the functions of a water hose, a wiring tube, a solar power generation panel, and a framework supporting column (rod-shaped body).

Perovskite can be spray-coated and printed like an inkjet printer. Therefore, unlike conventional silicon or the like, it is not necessary to slice from the ingot, which can contribute to remarkable cost reduction. In addition, the power generation efficiency is currently comparable to that of silicon, and conversion efficiency of about 22 to 23% or more has been realized. As an alternative to the perovskite solar cell, a dye-sensitized solar cell, an organic thin-film solar cell, or the like can be used, and for example, a dye-sensitized cell having a transmittance of 80% or more may be used.

When a transparent resin is used as the base material of the cylindrical pedestal 3000 for solar power generation devices, since the perovskite can also be made transparent, the entire cylindrical pedestal 3000 for solar power generation devices can be made transparent.

Figure 3:
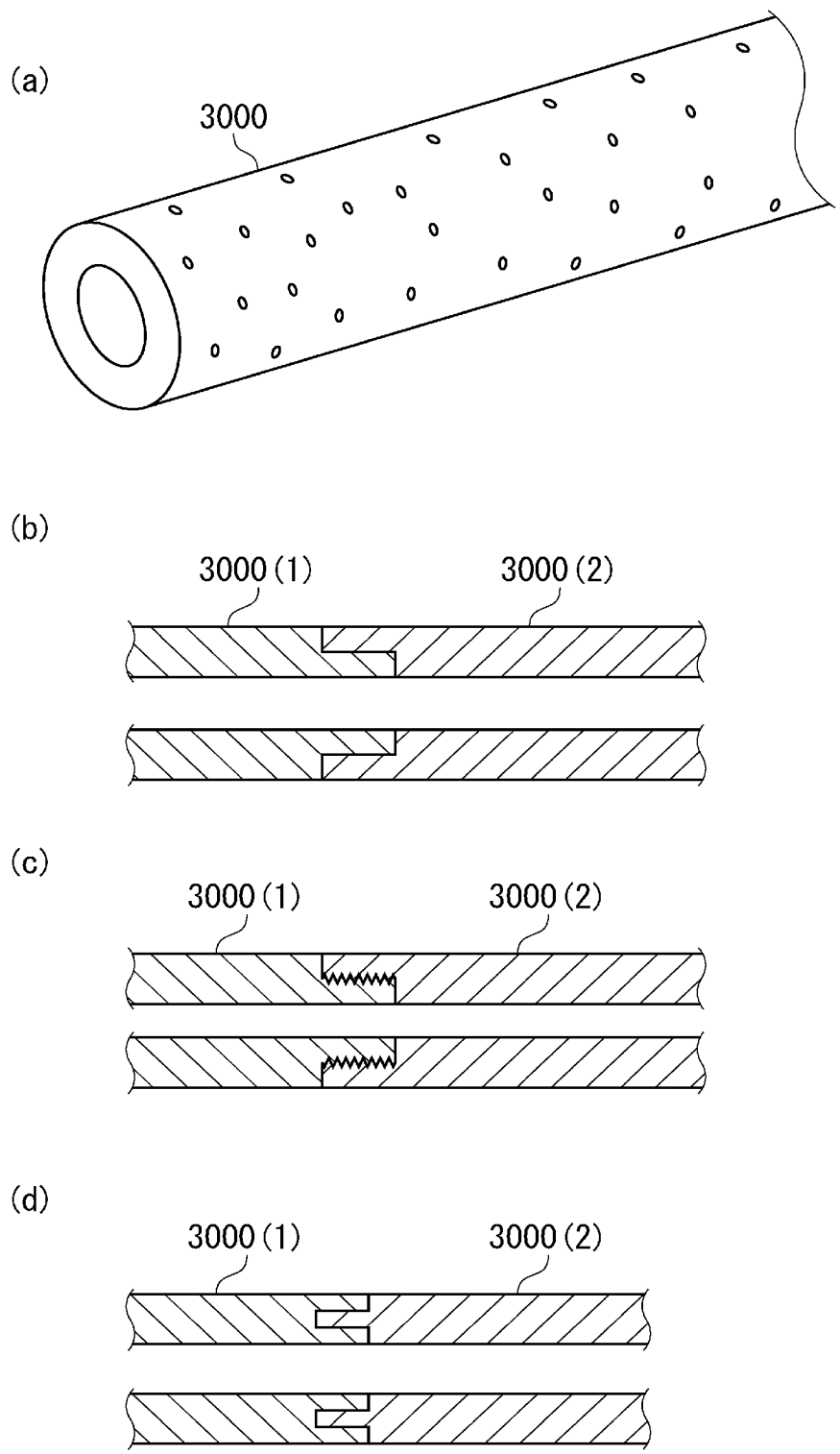

FIGS. 3(b) to 3(d) are cross-sectional views of the connection portion for explaining a connection mode when connecting cylindrical pedestals 3000 (1) and 3000 (2) for solar power generation devices. The present invention is not limited to the state shown in FIG. 3, and any known rod-shaped body connection mode can be adopted.

With the above-mentioned configuration and the like, the temperature of the power generation part such as a solar panel can be lowered by passing water, hot water can be supplied by the water, and so-called temperature difference cooling can be performed. Temperature difference cooling is cooling performed using the property that when one end of a specific material becomes hot, the other end is cooled. For example, the solar power generation device according to the present invention may be installed above an herb garden on the roof. While securing appropriate solar radiation for herbs, it is possible to enjoy the benefits of solar power generation and hot water at the same time.

In the configuration of FIG. 1, the panels can be replace and maintained with power generation panels in the form of a sheet-shaped slit, and the solar power generation panel which may deteriorate over time in several years to several decades can be appropriately replaced, which is preferable.

The pedestal 1000 and the like for solar power generation devices integrated with solar power generation panels according to the above description are not limited to the description in the embodiment, but the configuration, structure, and materials can be changed and arranged as appropriate within the scope of the object of the present invention and within a range obvious to those skilled in the art.

INDUSTRIAL APPLICABILITY

The present invention can be suitably adopted particularly for lands and spaces such as fallow fields, abandoned cultivated lands, and rooftops of buildings, which have been overlooked by humans.

REFERENCE SIGNS LIST

1000: Pedestal for solar power generation devices integrated with solar power generation panels 1100: Support
1200: Sheet-shaped thin-film solar cell panel
1300: Base

What is claimed is:

1. A pedestal for solar power generation devices integrated with solar power generation panels, in which
the pedestal is fixed to at least one of a plurality of supporting columns projecting upward in an installation area; and
the pedestal has a rod shape and is integrally provided at least along a curved upper surface thereof in a state in which an entire surface of a sheet-shaped solar power generation panel is not separated from the curved upper surface, wherein
the pedestal has a cavity in which the wirings are accommodated and which is formed by a central recess provided at the top of the curved upper surface of the base of the pedestal for solar power generation devices and the sheet-shaped solar power generation panel that closes the central recess as a lid, wherein
the central recess is formed by the inner surface of the base curving inward together with the outer surface of the base, and has an inwardly convex shape.

2. The pedestal for solar power generation devices integrated with solar power generation panels according to claim 1, wherein
the pedestal is horizontally fixed to the supporting column.

3. The pedestal for solar power generation devices integrated with solar power generation panels according to claim 1, wherein
an engagement portion capable of connecting the pedestal for solar power generation devices integrated with solar power generation panels to another pedestal for solar power generation devices integrated with solar power generation panels to form a rod-shaped body is provided at an edge of the cavity.

4. The pedestal for solar power generation devices integrated with solar power generation panels according to claim 3, wherein
the edge has an electrical connection portion that electrically connects the pedestals for solar power generation devices placed adjacent to each other.

5. The pedestal for solar power generation devices integrated with solar power generation panels according to claim 4, wherein
when the pedestal for solar power generation devices integrated with solar power generation panels is connected to another pedestal for solar power generation devices integrated with solar power generation panels to form a rod-shaped body, the electrical connection portion is configured as a joint connector that completes electrical connection simultaneously with the physical connection.

6. The pedestal for solar power generation devices integrated with solar power generation panels according to claim 1, wherein
the pedestal has another cavity so that cooling water can pass therein along a longitudinal direction of the base of the pedestal for solar power generation devices.

7. The pedestal for solar power generation devices integrated with solar power generation panels according to claim 6, wherein
the another cavity is provided with a plurality of sprinkling holes at a bottom so that plants cultivated in the installation area can be watered.

8. The pedestal for solar power generation devices integrated with solar power generation panels according to claim 6, further comprising:
a water passage hose arranged in the another cavity, wherein
cooling water passes through the water passage hose.

9. The pedestal for solar power generation devices integrated with solar power generation panels according to claim 6, wherein
the cooling water after passing is used as hot water.

10. The pedestal for solar power generation devices integrated with solar power generation panels according to claim 1, wherein
the solar power generation panel is configured as a sheet-type panel, and is configured to be removable and replaceable by sliding from the base of the pedestal for solar power generation devices.

11. The pedestal for solar power generation devices integrated with solar power generation panels according to claim 1, wherein
a cross-sectional shape thereof is a half-pipe shape having a curved upper surface and a flat bottom surface.

12. The pedestal for solar power generation devices integrated with solar power generation panels according to claim 1, wherein
the base of the pedestal for solar power generation devices is formed of an aluminum material.

13. The pedestal for solar power generation devices integrated with solar power generation panels according to claim 1, wherein
the solar power generation panel is a perovskite thin-film solar cell.

14. The pedestal for solar power generation devices integrated with solar power generation panels according to claim 13, wherein
the base of the pedestal for solar power generation devices is formed of a transparent resin material.

15. The pedestal for solar power generation devices integrated with solar power generation panels according to claim 13, wherein
the base of the pedestal for solar power generation devices has another cavity with the inside formed in a hollow cylindrical shape so that water can pass along a longitudinal direction thereof.

16. The pedestal for solar power generation devices integrated with solar power generation panels according to claim 15, further comprising:
sprinkling holes capable of sprinkling water toward a lower side, of the another cavity formed in the hollow cylindrical shape.

17. The pedestal for solar power generation devices integrated with solar power generation panels according to claim 13, wherein
the solar power generation panel is integrally and inseparably provided around an entire circumference of the base of the pedestal for solar power generation devices.

18. The pedestal for solar power generation devices integrated with solar power generation panels according to claim 17, wherein
the solar power generation panel is coated around an entire circumference of the base of the pedestal for solar power generation devices.

* * * * *